US012811109B2

(12) United States Patent
Lim et al.

(10) Patent No.: US 12,811,109 B2
(45) Date of Patent: Nov. 24, 2026

(54) PLASMA SHIELD ASSEMBLY AND PLASMA PROCESSING APPARATUS INCLUDING THE SAME

(71) Applicant: Samsung Display Co., Ltd., Yongin-si (KR)

(72) Inventors: Eun Chan Lim, Yongin-si (KR); Hae Young Yoo, Yongin-si (KR); Eun Soo Lee, Yongin-si (KR); Seon Uk Park, Yongin-si (KR); Yong Mun Chang, Yongin-si (KR); Hyun Ku Park, Yongin-si (KR); Jae Ryong Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 428 days.

(21) Appl. No.: 18/602,334

(22) Filed: Mar. 12, 2024

(65) Prior Publication Data

US 2024/0420928 A1 Dec. 19, 2024

(30) Foreign Application Priority Data

Jun. 15, 2023 (KR) ........................ 10-2023-0077031

(51) Int. Cl.
*H01J 37/32* (2006.01)

(52) U.S. Cl.
CPC .. *H01J 37/32633* (2013.01); *H01J 37/32357* (2013.01); *H01J 2237/334* (2013.01)

(58) Field of Classification Search
CPC ........... H01J 37/32357; H01J 37/32633; H01J 37/32651; H01J 2237/334
See application file for complete search history.

(56) References Cited

U.S. PATENT DOCUMENTS

| | | | |
|---|---|---|---|
| 10,847,348 B2 | 11/2020 | Tsukahara et al. | |
| 11,508,555 B2 | 11/2022 | Kawamura | |
| 11,610,766 B2 | 3/2023 | Yokoyama et al. | |
| 2005/0000442 A1 | 1/2005 | Hayashi et al. | |
| 2005/0223986 A1 | 10/2005 | Choi et al. | |
| 2010/0261354 A1* | 10/2010 | Bettencourt | H01J 37/16 29/402.02 |
| 2018/0294144 A1* | 10/2018 | Aubuchon | C23C 16/345 |
| 2019/0333743 A1* | 10/2019 | Yoon | C23C 16/45563 |

(Continued)

FOREIGN PATENT DOCUMENTS

| | | |
|---|---|---|
| CN | 1715442 A | 1/2006 |
| JP | 4493932 B2 | 6/2010 |

(Continued)

*Primary Examiner* — Joseph A Miller, Jr.
(74) *Attorney, Agent, or Firm* — Innovation Counsel LLP

(57) ABSTRACT

A plasma shield assembly may include a guide component including first through holes connected to plasma generators that generate radicals using process gas, and a shield component detachably coupled to the guide component and disposed on a lower surface of the guide component, and including second through holes aligned with the first through holes to pass the radicals from the first through holes. The shield component may be spaced apart from the lower surface of the guide component with a gap formed between the shield component and the guide component. Bumper rings disposed adjacent to the second through holes to prevent the radicals from entering the gap.

20 Claims, 10 Drawing Sheets

(56) References Cited

U.S. PATENT DOCUMENTS

| | | | | |
|---|---|---|---|---|
| 2022/0093407 | A1* | 3/2022 | Tamamushi | B08B 7/0035 |
| 2022/0316063 | A1* | 10/2022 | Brown | C23C 16/50 |

FOREIGN PATENT DOCUMENTS

| | | | |
|---|---|---|---|
| JP | 2021089907 | A | 6/2021 |
| JP | 7142551 | B2 | 9/2022 |
| JP | 7175162 | B2 | 11/2022 |

* cited by examiner

PLASMA SHIELD ASSEMBLY AND PLASMA PROCESSING APPARATUS INCLUDING THE SAME

CROSS-REFERENCE TO RELATED APPLICATION

The present application claims priority to Korean patent application number 10-2023-0077031 filed on Jun. 15, 2023, the entire disclosure of which is incorporated herein by reference.

BACKGROUND

Field of Invention

Various embodiments of the present disclosure are directed to a plasma processing apparatus, and more particularly, to a plasma shield assembly for a remote plasma process to be applied to a large-area substrate, and a plasma processing apparatus including the plasma shield assembly.

Description of Related Art

With the development of information technology, the importance of a display device that is a connection medium between a user and information has been emphasized. Owing to the importance of the display device, the use of various display devices, such as a liquid crystal display (LCD) device and an organic light-emitting display device, has increased.

To fabricate a display device, various processes may be performed on a substrate for semiconductor elements. For example, processes such as etching, deposition, cleaning, and ashing may be involved. Among the aforementioned processes, an ashing process may include removing a photoresist pattern from a surface of the substrate using plasma.

Particularly, the ashing process may employ a remote plasma processing scheme where oxygen plasma is formed in a space separate from the chamber to supply oxygen radicals. Here, an ashing apparatus employing the remote plasma processing scheme may use a diffusion plate having a shower head structure. The diffusion plate having a shower head structure may uniformly apply radicals to the substrate. However, losses due to surface reactions and recombination when the radicals pass through the substrate may increase, resulting in significant reduction in ashing quality.

The information disclosed in this background section is only for enhancement of understanding of the background of the described technology and therefore it may contain information that does not form the prior art that is already known to a person of ordinary skill in the art.

SUMMARY

Various embodiments of the present disclosure are directed to a plasma processing apparatus with improved process performance. Various embodiments of the present disclosure are directed to a plasma processing apparatus including a plasma shield assembly for a remote plasma process, which is applied to a large-area surface, thus enabling radicals to be injected onto a substrate without loss and preventing a surface of a guide component from being contaminated.

One aspect of the present disclosure may provide a plasma shield assembly including: a guide component including first through holes connected to plasma generators that generate radicals using process gas; and a shield component detachably coupled to the guide component and disposed on a lower surface of the guide component, and including second through holes aligned with the first through holes to pass the radicals from the first through holes. The shield component may be spaced apart from the lower surface of the guide component with a gap formed between the shield component and the guide component., The plasma shield assembly further includes bumper rings disposed adjacent to the second through holes to prevent the radicals from entering the gap.

Each of the bumper rings may be disposed in the gap and encloses one of the second through holes.

Each of the bumper rings may be fastened to one surface of the shield component by bolts provided along a circumference of at least one of the bumper rings.

The bumper rings may be formed of insulating material including Teflon.

Each of outlets of the first through holes adjacent to the second through holes may have a radial shape.

The guide component may further include diffusion patterns disposed in the outlets, each of the outlets having the radial shape. Each of the diffusion patterns may have a conical shape.

Each of the second through holes of the shield component may have a sloped sidewall forming an acute angle with respect to the lower surface of the guide component.

A width of the sloped side wall increases with distance from the guide component.

The shield component may include a plate defining the second through holes, and spaced apart from the lower surface of the guide component to define the gap therebetween.

The shield component may include a groove formed on an edge of the plate, and may further include support components to make full contact with the groove.

The shield component may be fastened to one surface of the guide component by bolts provided along the support components.

Another aspect of the present disclosure may provide a plasma shield assembly including: a guide component including first through holes connected to plasma generators that generate radicals using process gas; and a shield component detachably coupled to the guide component and disposed on a lower surface of the guide component, and including second through holes aligned with the first through holes to pass through the second through holes, the radicals transmitted from the plasma generators through the first through holes. The shield component may contact the lower surface of the guide component, and may be fastened to the lower surface of the guide component by bolts provided along circumferences of the second through holes.

Yet another aspect of the present disclosure may provide a plasma processing apparatus including: a chamber defining space where a substrate is disposed; plasma generators disposed on an upper portion of the chamber and configured to generate radicals using process gas; a guide component including first through holes connected to the respective plasma generators; a shield component detachably coupled to the guide component and disposed on a lower surface of the guide component, and including second through holes aligned with the first through holes to pass the radicals from the first through holes; and a lower electrode disposed to face the plasma generators, and configured to allow the substrate to be mounted thereon. The shield component may be spaced from the lower surface of the guide component with a gap formed between the shield component and the guide component, and may further include bumper rings disposed adjacent to the second through holes to prevent the radicals from entering the gap.

Each of the bumper rings may be disposed in the gap and enclose one of the second through holes.

The bumper rings may be formed of insulating material including Teflon.

Each of the second through holes of the shield component may have a sloped sidewall forming an acute angle with respect to the lower surface of the guide component.

The shield component may include a plate defining the second through holes, and spaced apart from the lower surface of the guide component to define the gap therebetween.

The plate may function as an upper electrode when high-frequency power is applied thereto.

The high-frequency power may be applied to the shied component in case that the substrate is separated from the lower electrode.

The plasma generators may convert the process gas to plasma and generate the radicals.

DETAILED DESCRIPTION

Hereinafter, embodiments of the present disclosure will be described in detail with reference to the attached drawings. In the following description, only parts required for understanding of operations in accordance with the present disclosure will be described, and explanation of the other parts will be omitted not to make the gist of the present disclosure unclear. Accordingly, the present disclosure is not limited to the embodiments set forth herein but may be embodied in other types. Rather, these embodiments are provided so that the present disclosure will be thorough and complete, and will fully convey the technical spirit of the disclosure to those skilled in the art.

It will be understood that when an element is referred to as being "coupled" or "connected" to another element, it can be directly coupled or connected to the other element or indirectly coupled or connected to the other element with intervening elements therebetween. The terminology used herein is for the purpose of describing particular embodiments only and is not intended to be limiting. In the specification, when an element is referred to as "comprising" or "including" a component, it does not preclude another component but may further include other components unless the context clearly indicates otherwise. The phrases "at least one of X, Y, and Z" and "at least one selected from the group consisting of X, Y, and Z" may be construed as X only, Y only, Z only, or any combination of two or more of X, Y, and Z (for instance, XYZ, XYY, YZ, and ZZ). As used herein, the term "and/or" can include any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Figure 1:
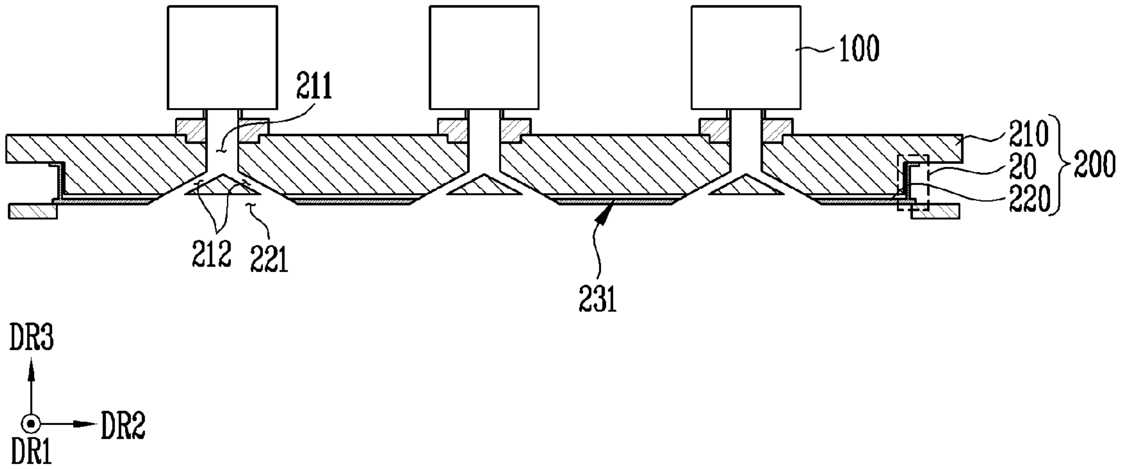
FIG. 1 is a sectional view illustrating a plasma shield assembly in accordance with an embodiment of the present disclosure.

FIG. 1 is a sectional view illustrating a plasma shield assembly 200 in accordance with an embodiment of the present disclosure.

Referring to FIG. 1, the plasma shield assembly 200 in accordance with an embodiment of the present disclosure may include a guide component 210 and a shield component 220.

The guide component 210 may be coupled to plasma generators 100 disposed on an upper portion of chamber. The guide component 210 may include first through holes 211. The first through holes 211 may be respectively connected to the plasma generators 100 configured to generate radicals using process gas. For example, the guide component 210 may be a lead plate designed to maintain vacuum in the chamber in which the plasma process is performed. The guide component 210 may be coupled to the chamber in such a way that outlet ports of the plasma generators 100 disposed on the upper portion of the chamber are connected to the first through holes 211, thus sealing the upper portion of the chamber.

The first through holes 211 formed in the guide component 210 may be oriented in a negative third direction DR3, indicating the opposite direction of the DR3 arrow in the coordinate system shown in FIG. 1. Hence, the first through holes 211 open into the chamber. The first ends of the first through holes 211 formed in the guide component 210 may be connected to the outlet ports of the plasma generators 100, and the second ends of the first through holes 211 may be connected to second through holes 221 formed in the shield component 220. In the guide component 210, outlets 212 that connect the first through holes 211 to the second through holes 221 each may have a radial shape. Furthermore, the guide component 210 may further include diffusion patterns disposed in the respective radial-shaped outputs 212. Each of the diffusion patterns may have a conical shape. Due to the aforementioned structure, the guide component 210 may provide diffusion space in the first through holes 211 to facilitate diffusion into the chamber.

The shield component 220 may be detachably coupled to the guide component 210 and disposed on a lower surface of the guide component 210. The shield component 220 may include the second through holes 221 that are aligned with the first through holes 211 of the guide component 210. For example, the shield component 220 may be coupled to the upper portion of the chamber, thus facing a substrate support on which a substrate is mounted. Radicals may be discharged onto the substrate through the second through holes 221 formed in a plate of the shield component 220. In more detail, the shield component 220 may be configured to directly discharge radicals transmitted from the plasma generators 100 through the first through holes 211 of the guide component 210 toward the substrate through the second through holes 221. Therefore, as the shield component 220 is detachably coupled to the guide component 210, only the shield component 220 may be easily replaced with a new one in the case where contamination of the shield component 220 reaches a threshold. Furthermore, the shield component 220 is configured to directly discharge radicals onto the substrate so that loss of radicals can be reduced, thereby preventing a degradation in process capability.

The shield component 220 may function as an upper electrode when high-frequency power is applied thereto. For example, the shield component 220 may be made of a metal material including aluminum to allow high-frequency power to pass therethrough. However, if the shield component 220 is formed of a metal material having low resistance, there is also an increased possibility of arcing phenomenon occurring while performing the process. To reduce the arcing phenomenon, the shield component 220 may be coupled to the guide component 210 at a position spaced apart from the lower surface of the guide component 210 to form a gap 231 between the shield component 220 and the guide component 210. Therefore, the shield component 220 may be provided as an upper electrode of a capacitor coupled plasma (CCP) structure, thus allowing normal plasma discharge when high-frequency power is applied, without causing the arcing phenomenon.

The shield component 220 may include bumper rings to prevent radicals from being drawn between the shield component 220 and the guide component 210. The bumper rings may be disposed adjacent to the second through holes 221 of the shield component 220, thus preventing radicals (or process gas) from being drawn into the gap 231 formed between the shield component 220 and the guide component 210. Detailed description of the bumper rings will be made below with reference to FIGS. 3 to 5.

Figure 2:
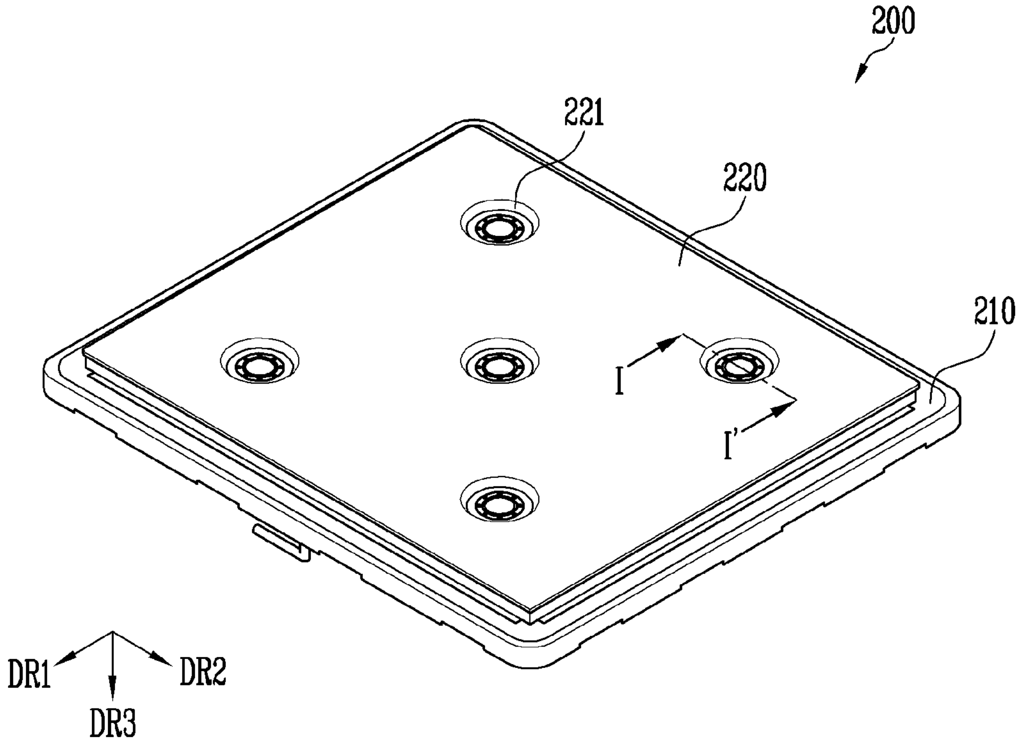
FIG. 2 is a perspective view illustrating a plasma shield assembly of FIG. 1.

FIG. 2 is a perspective view illustrating the plasma shield assembly of FIG. 1.

Referring to FIG. 2, an example of the guide component 210 and the shield component 220 included in the plasma shield assembly 200 can be described.

The guide component 210 and the shield component 220 may be formed to have the form of a rectangular flat plate when viewed from the bottom of the chamber. However, the rectangular shape is merely an example, and is not a limitation. For example, various forms of flat plates may be provided depending on the shape of an upper surface of the chamber to which the plasma shield assembly 220 is mounted. However, the shield component 220 may be a flat plate having a cross-sectional surface area less than that of the guide component 210. The shield component 220 may be detachably coupled to the guide component 210 by resting above an empty space formed by a stepped portion in the periphery of the guide component 210. Detailed description pertaining to the coupled portion will be made below with reference to FIG. 6.

In an embodiment, the guide component 210 and the shield component 220 may include the flat plate and the circular through holes formed in the flat plate. The through holes allow radicals (or process gas) generated from the plasma generators 100 to pass therethrough and be discharged onto the substrate. For example, the guide component 210 may include the first through holes 211, and the shield component 220 may include the second through holes 221. The first through holes 211 and the second through holes 221 may be connected to each other, allowing communication therebetween, and may be formed at respective positions corresponding to the plasma generators 100 coupled to the plasma shield assembly 200. In other words, to discharge radicals onto the substrate, the outlet ports of the plasma generators 100 may be connected to the respective first through holes 211, and the second through holes 221 overlapping the first through holes 211 may be connected to the respective first through holes 211. Furthermore, each of the first through holes 211 and the second through holes 221 may have a radial shape and be inclined in a negative direction in the third direction DR3, thus allowing radicals to be diffused toward the substrate.

Figure 3:
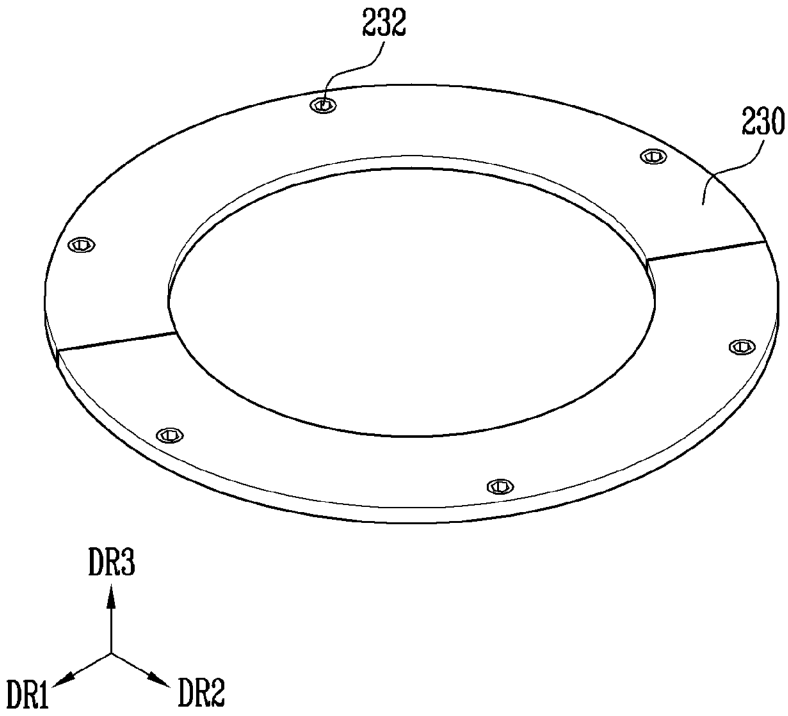
FIG. 3 is a perspective view illustrating a bumper ring included in the plasma shield assembly of FIG. 1.

FIG. 3 is a perspective view illustrating a bumper ring 230 included in the plasma shield assembly 200 of FIG. 1.

Referring to FIG. 3, an example of bumper rings 230 included in the plasma shield assembly 200 can be described. The bumper rings 230 may be disposed between the guide component 210 and the shield component 220 of the plasma shield assembly 200.

In an embodiment, each of the bumper rings 230 may have a circular annular shape to enclose the second through holes 221 of the shield component 220. Each of the bumper rings 230 may have an inside diameter greater than that of the second through holes 221 to enclose the second through holes 221. The "inside diameter," as used herein, indicates the diameter of the opening portion in the center of the bumper ring 230. Each of the bumper rings 230 may have an integrated circular annular shape, or may have a circular annular shape where two identical semicircular shapes are combined to face each other.

The bumper rings 230 may include fastening holes 232 for attachment. For example, the fastening holes 232 may be formed to pass through the bumper rings 230 in the third direction DR3, and may be arranged at positions spaced apart from each other at regular intervals along the perimeter of the bumper rings 230. The bumper rings 230 may be fastened to one surface of the shield component 220 by bolts inserted into the fastening holes 232.

Furthermore, the bumper rings 230 may be formed of insulating material including Teflon. For example, the bumper rings 230 may be formed of Teflon, or may be formed of material resistant to plasma and coated with Teflon on the surface thereof. However, the bumper rings 230 are not limited to specific material, so long as it can block high-frequency power and plasma.

Figure 4:
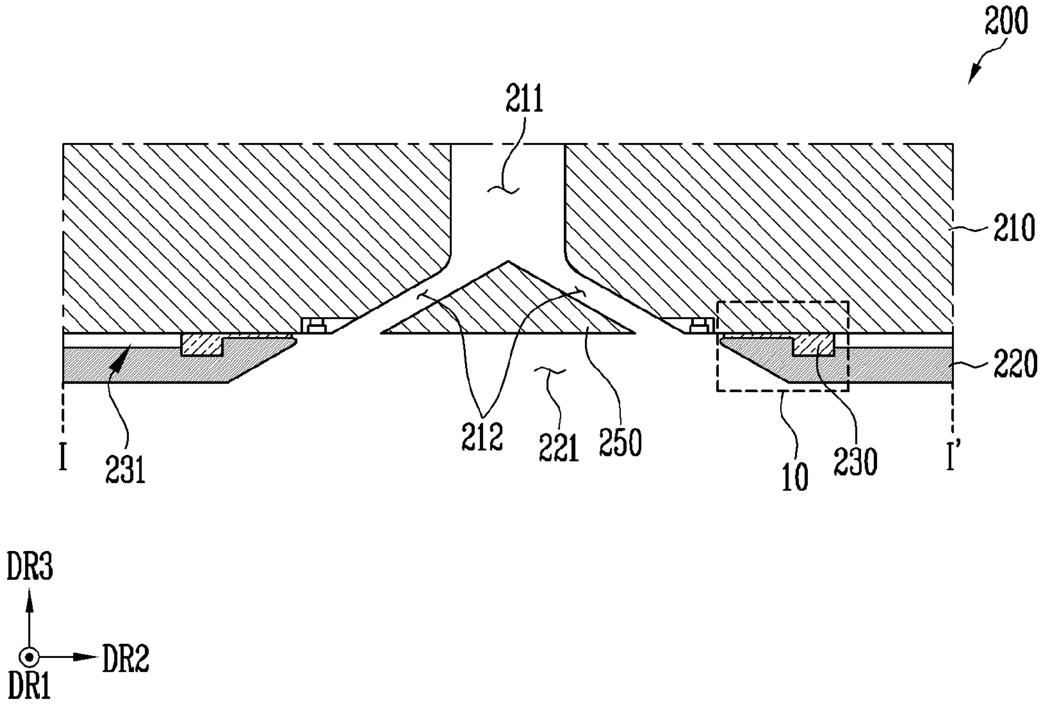
FIG. 4 is a sectional view illustrating an embodiment of a portion of the plasma shield assembly taken along line I-I' of FIG. 2.

FIG. 4 is a sectional view illustrating an embodiment of a portion of the plasma shield assembly taken along line I-I' of FIG. 2.

Referring to FIG. 4, an example of arrangement of the bumper rings 230 in the plasma shield assembly 200 can be described.

Each of the bumper rings 230 may be disposed to enclose any one of the second through holes 221 between the guide component 210 and the shield component 220. For example, the shield component 220 may have concave depressions formed along the perimeters of the second through holes 221 in the upper surface thereof to be coupled to the guide component 210 so that the bumper rings 230 can be inserted into the concave depressions. The cross-section of each of the depressions may have the same circular annular shape as each bumper ring 230. The bumper rings 230 may be fitted into the respective depressions formed in the upper end of the second through holes 221 and be fixed horizontally in place. The bumper rings 230 may be fastened to the upper surface of the shield component 220 by bolts and be fixed vertically in place. Detailed description pertaining to fixing the bumper rings 230 in place will be made later herein with reference to FIG. 5.

By positioning the bumper rings 230 at the junctions where the guide component 210 and the shield component 220 are brought into contact with and coupled to each other, it is possible to prevent a physical grinding phenomenon due to thermal expansion differences between metals caused by high temperatures, as well as impulsive grinding phenomenon at contact portions between metals. The bumper rings 230 may maintain the gap 231 formed between the guide component 210 and the shield component 220 by the thickness of the bumper rings 230, and may be closely fixed to the perimeters of the through holes, thus preventing radicals (or process gas) from being drawn into the gap 231. Furthermore, the bumper rings 230 may block high-frequency power from being applied to the guide component 210, thus preventing an arcing phenomenon during application of high-frequency power.

Referring to FIGS. 1 and 4, radicals supplied into the chamber through the plasma generators 100 may undergo primary diffusion through the first through holes 211 of the guide component 210 and then secondary diffusion through the second through holes 221 of the shield component 220, thus resulting in discharge perpendicular to the substrate. For example, the first through holes 211 of the guide component 210 may be designed such that the outlets 212 adjacent to the second through holes 221 are formed in a radial shape to allow radicals supplied toward the substrate to be primarily diffused. The outlets 212 of the first through holes 211 may include diffusion patterns 250 each having a conical shape in the respective radial spaces of the outlets 212. As the diffusion patterns 250 are included in the outlets 212 of the first through holes 211, radicals discharged vertically may change the movement direction due to the angle of conical shape, thus resulting in wide diffusion.

In one embodiment, each of the second through holes 221 of the shield component 220 may have a radial shape to secondarily diffuse radicals transmitted form the corresponding first through hole 211. In more detail, each of the second through holes 221 may have a diameter greater than that of each of the first through holes 211 formed thereover. Furthermore, each of the second through holes 221 may have a sloped sidewall forming an acute angle with respect to the lower surface of the guide component 210. Here, the width of the sloped sidewall of each of the second through holes 221 may be reduced as it gets closer to the first through hole 211, and may increase with distance from the first through hole 211. Because the width of the sloped sidewall of the second through hole 221 is increases with distance from the guide component 210, radicals received from the first through hole 211 may be diffused more widely.

Figure 5:
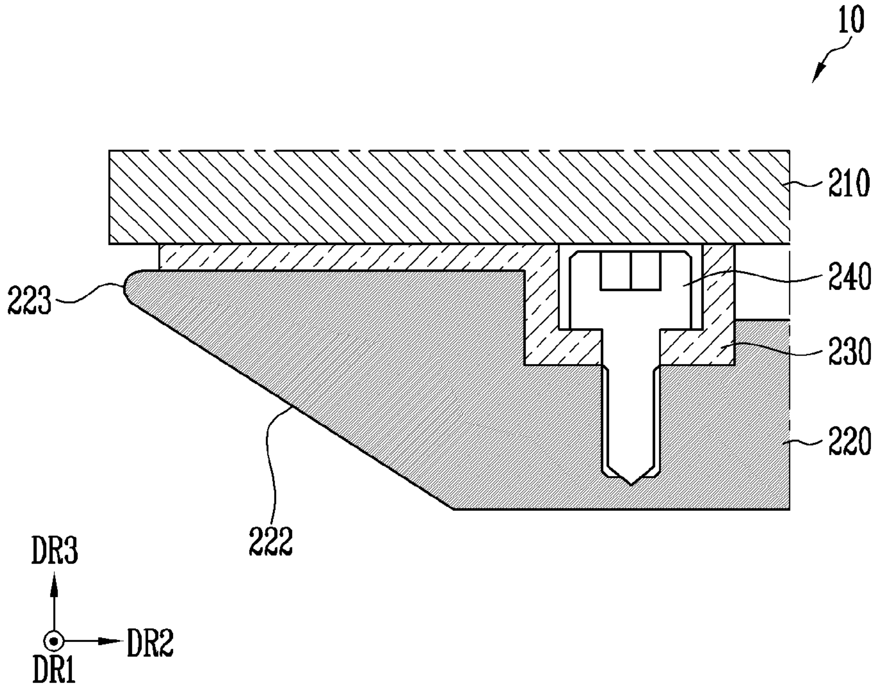
FIG. 5 is a sectional view illustrating an embodiment of a fastener for fastening the bumper ring to a shield component of FIG. 4.

FIG. 5 is a sectional view illustrating an embodiment of a fastener for fastening the bumper ring 230 to the shield component 220 of FIG. 4.

In the plasma shield assembly 200, each of the bumper rings 230 may be fixed to the upper surface of the shield component 220 by fasteners disposed along the periphery of the corresponding bumper ring. In embodiments, the fasteners may include bolts 240 for fastening the bumper ring 230 to the shield component 220.

Referring to FIGS. 4 and 5, each of the bumper rings 230 may have a circular annular shape. The bumper rings 230 may be fitted into the depressions formed in the upper surface of the shield component 220, thus being fixed in place and unable to slide around. The bumper rings 230 fitted into the depressions may be fixed in position securely by the bolts 240. Here, each of the bumper rings 230 may have a stepped structure with a varying thickness. Each of the bumper rings 230 may be designed in such a way that the peripheral portion having the fastening holes into which the bolts 240 are inserted has a thickness greater than that of the inner side (see FIG. 4). The stepped structure of the bumper ring 230 with a varying thickness may ensure the stability of the coupled state.

The shield component 220 to which the bumper rings 230 are fastened may have an edge portion 223 formed with a curved line of a predetermined curvature corresponding to a rounded shape. In each of the second through holes 221 of the shield component 220, the edge portion 223 may correspond to an end of the sloped sidewall 222, which forms an acute angle with respect to the lower surface of the guide component 210. Therefore, the shield component 220 may prevent an arcing phenomenon from occurring on the edge portion 223 during application of high-frequency power. The arcing phenomenon is a type of plasma arcing phenomenon such as spark discharge caused by collective electron emission, leading to high current and process failures.

Furthermore, the shield component 220 to which the bumper rings 230 are attached may have the second through holes 221 with sloped sidewalls 222. The width of the sloped sidewall 222 of each of the second through holes 221 may be increased in a direction away from one surface of the guide component 210. By forming the sloped sidewalls 222 of the second through holes 221 to get wider with increasing distance from the first through hole 211, the shield component 220 may minimize disruption to the flux of discharged radicals.

Figure 6:
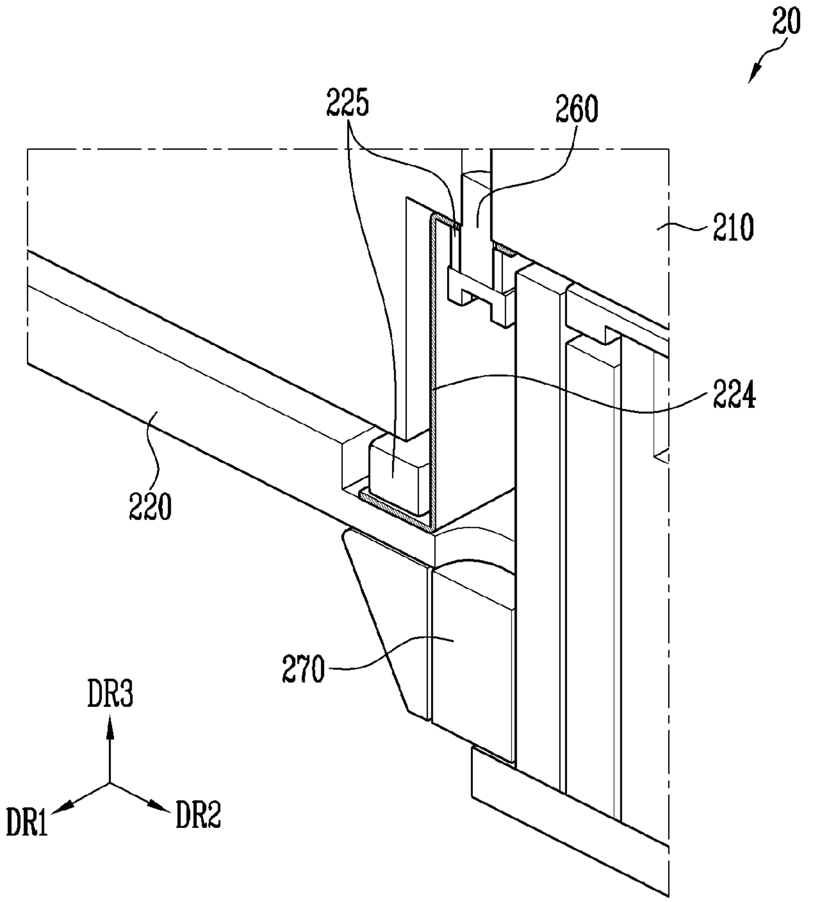
FIG. 6 is a sectional view illustrating an embodiment of a portion where a guide component and the shield component are coupled to each other in the plasma shield assembly of FIG. 1.

FIG. 6 is a sectional view illustrating an embodiment of a portion where the guide component 210 and the shield component 220 are coupled to each other in the plasma shield assembly of FIG. 1.

Referring to FIG. 6, an example of a structure of detachably coupling the shield component 220 to the guide component 210 in the plasma shield assembly 200 can be described.

In an embodiment, the shield component 220 may include a plate, which defines the second through holes 221 and is spaced apart from the lower surface of the guide component 210 to define a gap. The shield component 220 may include a groove 224 formed in an edge of the plate. The shield component 220 may further include support components 225 configured to make full contact with the groove 224. The shield component 220 may be fastened to the one surface of the guide component 210 by the bolts 260 provided along the support components 225.

For example, in the case where the shield component 220 is coupled to the lower surface of the guide component 210, the shield component 220 may include the groove 224, which extends in the third direction DR3 from the edge of the plate and maintains contact with the lower surface of the guide component 210. The groove 224 may have a shape including a bent structure in the second direction DR2, oriented outward and perpendicular to the third direction DR3, thus allowing it to overlap the lower surface of the guide component 210. In more detail, the groove 224 may include, on the edge of the plate, a first surface parallel to a side surface of the shield component 220, and a second surface parallel to the lower surface of the guide component 210, and may be formed in a shape where the first surface and the second surface are perpendicular to each other. The length of the groove 224 may be based on the thickness of the bumper rings 230 and the thickness of the shield component 220. In other words, the shield component 220 may be coupled to one surface of the guide component 210 with a gap corresponding to the length of the groove 224 therebetween. Therefore, it is possible to prevent an arcing phenomenon that may occur due to instability in the contact portion in application of high-frequency power.

The shield component 220 may be fastened to the one surface of the guide component 210 with the groove 224 interposed therebetween by the bolts 260 provided along the support components 225. For example, the bolts 260 may be inserted in a state where the support components 225 and one surface of the groove 224 overlap each other, thus allowing the support components 225 and the groove 224 to be fixed in place. As the bolts 260 pass through the support components 225 overlapping one surface of the grooves 224 and are tightened thereinto, the shield component 220 may be coupled to one surface of the guide component 210 with a larger contact area. In other words, the shield component 220 may enhance the coupling stability by making surface contact.

In an embodiment, the shield component 220 may further include blocks 270 disposed to support the shield component 220 on the edge of the plate. The blocks 270 may be formed of insulating material including ceramic. For example, the blocks 270 are not limited to a specific material, so long as it can block high-frequency power in application of the high-frequency power, and prevent radicals from being stagnated on the edges thereof.

Figure 7:
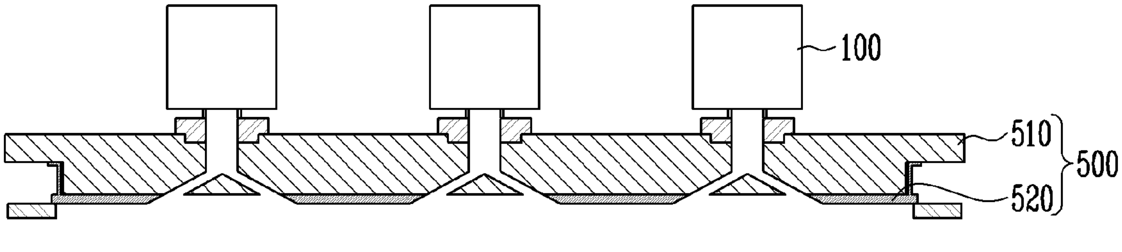
FIG. 7 is a sectional view illustrating a plasma shield assembly in accordance with an embodiment of the present disclosure.

FIG. 7 is a sectional view illustrating a plasma shield assembly 500 in accordance with an embodiment of the present disclosure.

Referring to FIG. 7, the plasma shield assembly 500 in accordance with an embodiment of the present disclosure may include a guide component 510 and a shield component 520. Furthermore, the plasma generators 100 and the guide component 510 are the same configurations as the embodiment of FIG. 1, and there may be differences in the shield component 520. Hereinafter, repetitive explanations will be omitted.

Referring to FIG. 7, the shield component 520 of the plasma shield apply 500 may contact the lower surface of the guide component 510. Hence, there is no gap between the guide component 510 and the shield component 520 of the plasma shield assembly 500, and separate bumper rings may not be placed. Instead, the shield component 520 of the plasma shield assembly 500 may be brought into contact with and coupled to the lower surface of the guide component 510 by bolts disposed adjacent to second through holes 521. As the shield component 520 is fastened to and brought into close contact with the guide component 510 by the bolts without using bumper rings, the shield component 520 may be prevented from sagging.

Figure 8:
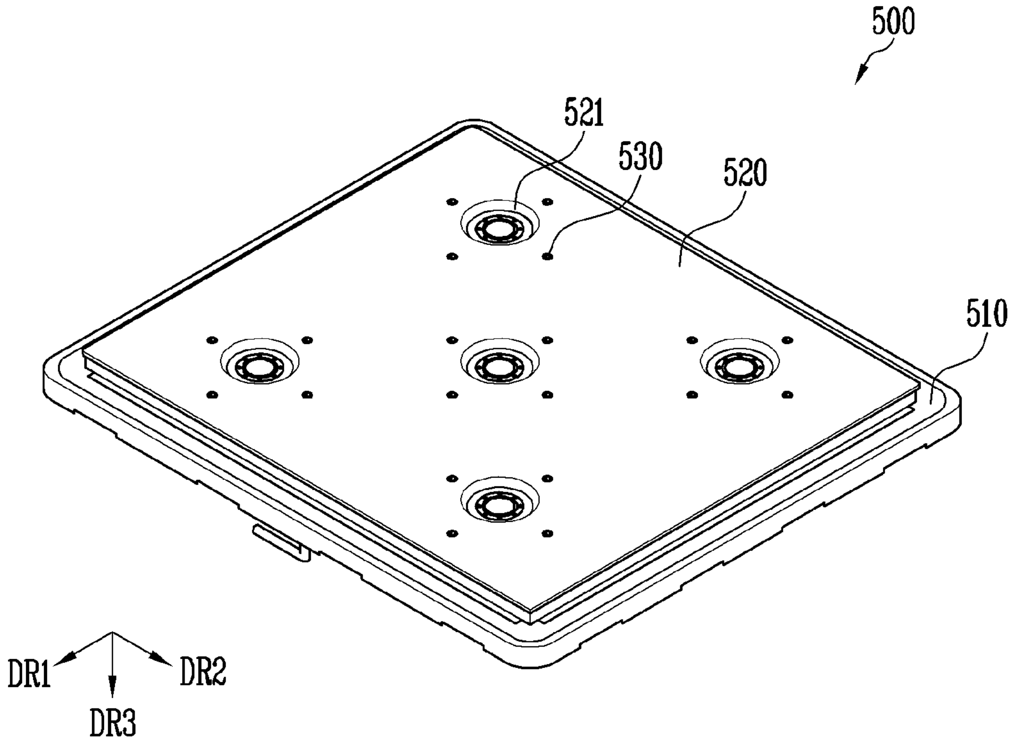
FIG. 8 is a perspective view illustrating the plasma shield assembly of FIG. 7.

FIG. 8 is a perspective view illustrating the plasma shield assembly 500 of FIG. 7.

Referring to FIG. 8, the guide component 510 and the shield component 520 included in the plasma shield assembly 500 in accordance with an embodiment of the present disclosure can be described. Hereinafter, repetitive explanations will be omitted.

In an embodiment, the guide component 510 and the shield component 520 may include a flat plate, and circular through holes formed in the flat plate. The through holes allow radicals discharged from the plasma generators 100 toward the substrate to pass therethrough. For example, the shield component 520 may include second through holes 521. The second through holes 521 may be connected to the first through holes, allowing communication therebetween, and may be formed at respective positions corresponding to the plasma generators 100 coupled to the plasma shield assembly 500.

Referring to FIG. 8, the shield component 520 may be brought into contact with and coupled to the lower surface of the guide component 510, and may be fixed to the lower surface of the guide component 510 by bolts disposed along the perimeter of the second through holes 521. For example, the flat plate of the shield component 520 may have fastening holes 530 through which the bolts can pass. The flat plate of the shield component 520 may have a certain thickness, and the bolts may be coupled to the guide component 510 while passing through the plate of the shield component 520, thus along the shield component 520 and the guide component 510 to maintain the coupled state.

Hence, in the plasma shield assembly 500, the guide component 510 and the shield component 520 may be brought into contact with and coupled to each other by the bolts without any gap formed therebetween, thus forming an upper electrode.

Figure 9:
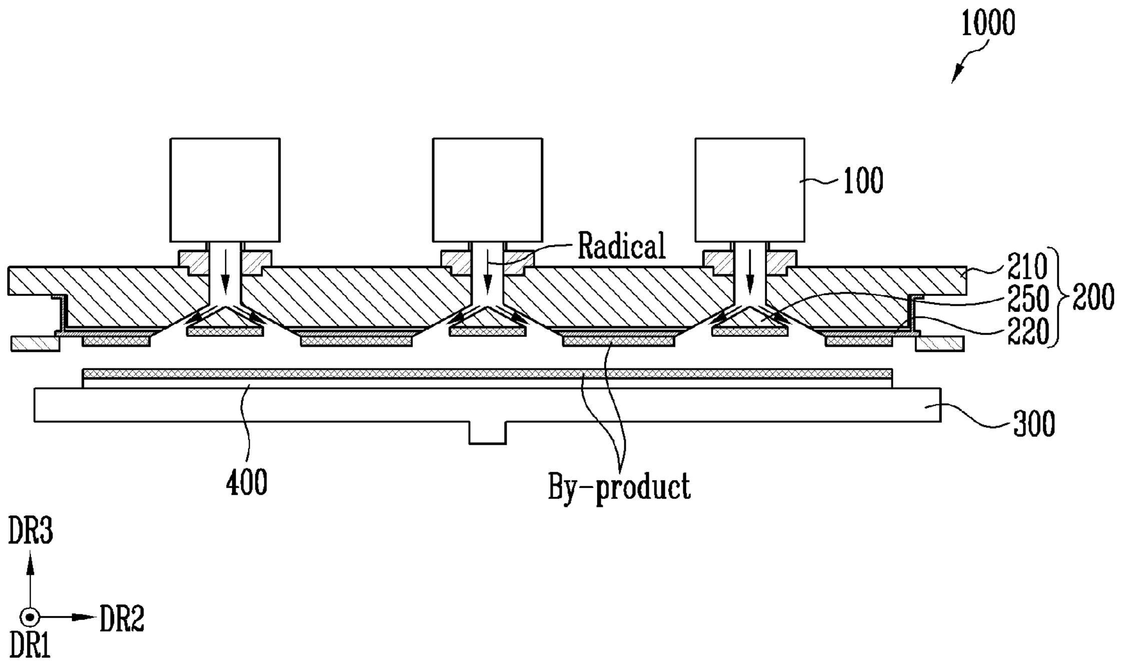
FIG. 9 is a sectional view illustrating an embodiment of a plasma processing apparatus including the plasma shield assembly of FIG. 1.

FIG. 9 is a sectional view illustrating an embodiment of a plasma processing apparatus 1000 including the plasma shield assembly 200 of FIG. 1.

Referring to FIG. 9, an example of performing an etching process and preventing internal surface contamination in the plasma processing apparatus 1000 can be explained.

The plasma processing apparatus 1000 may include, in a chamber, plasma generators 100, a guide component 210, a shield component 220, and a lower electrode 300. The plasma processing apparatus 1000 may perform a process of removing a photoresist pattern from a surface of a substrate using plasma. The plasma shield assembly 200 included in the plasma processing apparatus 1000 may have the same configuration as the embodiment of FIG. 1. Hereinafter, repetitive explanations will be omitted.

The chamber may define space in which the substrate is placed. The chamber may be isolated from a peripheral area, and may maintain a vacuum state through the use of a pump. Radicals (or process gas) generated from the plasma generators 100 may be supplied into the chamber.

The plasma generators 100 may generate radicals by inputting process gas. For example, the process gas (e.g., oxygen, vapor) may be provided in the form of a plasma state by a plasma source, and generate radicals in the plasma. The radicals (e.g., oxygen radicals, hydrogen radicals) may remove photoresist from the substrate 400 by reaction with the photoresist.

The lower electrode 300 may function as a substrate support disposed to face the plasma generators 100, with an upper surface designed to allow the substrate 400 to be mounted thereon. The substrate support may introduce or remove the substrate 400 into or from the chamber, and fix the substrate 400 in place while the process is performed. For example, if the substrate 400 is mounted on the substrate support, radicals generated from the plasma generators 100 may be discharged through the through holes of the plasma shield assembly 200.

To ensure uniform application of radicals discharged from narrow output ends of the plasma generators 100 to the substrate having a large surface area, the radicals may be directed through a diffusion plate such as a shower head. However, using the diffusion plate such as a shower head may lead to substantial losses due to surface reaction and recombination of radicals as the radicals pass therethrough, thus causing a reduction in process performance. Therefore, in the plasma shield assembly 200, the diffusion plate such as a shower head may be removed, and the upper electrode may be configured in the form of a flat plate, with through holes formed at specific positions in the flat plate to allow radicals (or process gas) to pass therethrough. In other words, in the shield component 220 of the plasma shield assembly 200, the second through holes connected to the first through holes of the guide component 210 are formed to extend from the output ends of the plasma generators 100, thus allowing radicals to be directly discharged onto the substrate 400. Therefore, the plasma shield assembly 200 may provide improved process performance by allowing radicals discharged through the through holes directly connected to the output ends of the plasma generators 100 to react with the photoresist without loss.

During the process, internal surfaces may be contaminated by by-products generated from the plasma generators 100. Given this, in the plasma shield assembly 200, the shield component 220 may be detachably coupled to the guide component 210 with the bumper rings 230 interposed therebetween, whereby the shield component 220 can block by-products, thus preventing the surface of the guide component 210 from being contaminated. The shield component 220 that becomes contaminated by by-products may be easily detached and replaced with a new one through the use of the bolts on the perimeter of the plate. Here, the by-products may be a photoresist stack layer formed during the process.

The diffusion patterns disposed in the outlets of the first through holes of the guide component 210 may not be blocked from by-products by the shield component 220. Therefore, the diffusion patterns may be designed as consumable components, thus allowing contaminated diffusion patterns affected by by-products to be removed and replaced with new ones.

Figure 10:
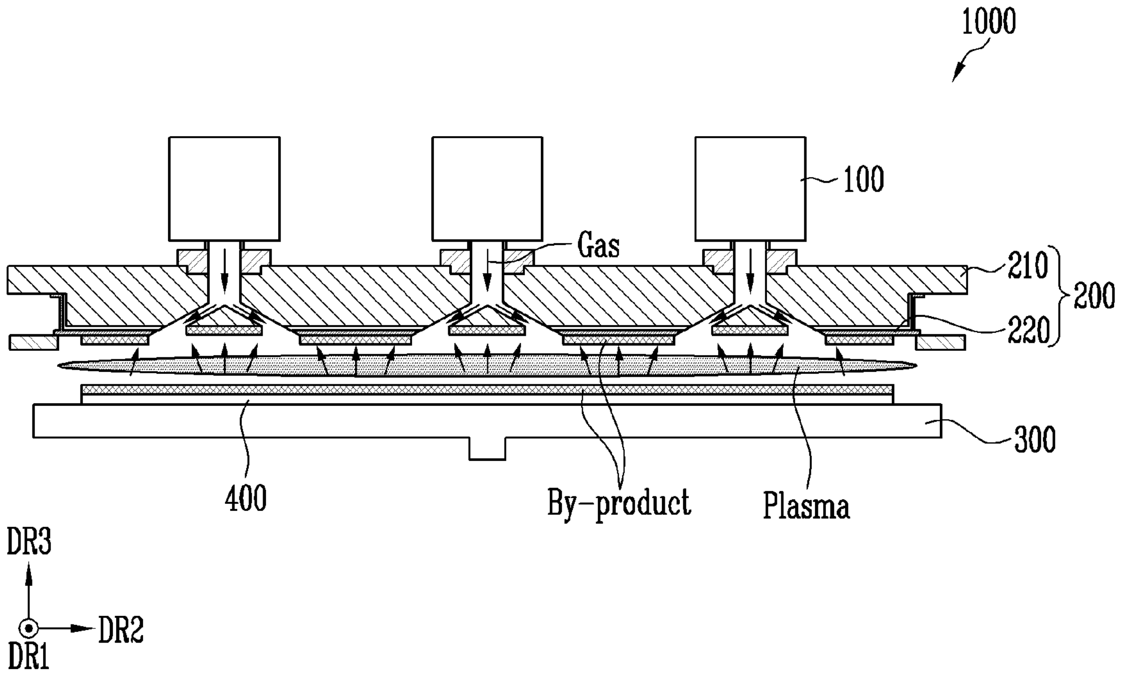
FIG. 10 is a sectional view illustrating another embodiment of the plasma processing apparatus including the plasma shield assembly of FIG. 1.

FIG. 10 is a sectional view illustrating another embodiment of the plasma processing apparatus 1000 including the plasma shield assembly 200 of FIG. 1.

Referring to FIG. 10, an example of removing by-products through corona discharge in the plasma processing apparatus 1000 can be explained.

The lower electrode 300 may be a conductive plate formed of a dielectric layer disposed to face the plasma shield assembly 200. Furthermore, the lower electrode 300 may be electrically connected to a power source for supplying high-frequency power.

In the plasma shield assembly 200, the plate of the shield component 220 may function as the upper electrode in application of high-frequency power. The shield component 220 may be disposed on the upper portion of the chamber, and may be electrically connected to the power source designed to supply high-frequency power. The shield component 220 may function as the upper electrode for formation of capacitively coupled plasma when high frequency power is applied thereto. In other words, the shield component 220 may form a capacitor coupled plasma (CCP) along with the lower electrode 300. For example, the plasma shield assembly 200 may generate high-density plasma by applying high-frequency power (radio frequency power) to the shield component 220 functioning as the upper electrode, and applying low-frequency power to the lower electrode 300 to create a CCP structure. In more detail, plasma generated and maintained by high-frequency power (radio frequency power) applied to the shield component 220, and the density of radicals constituting the plasma may be precisely adjusted by the low-frequency power applied to the lower electrode 300.

In an embodiment, if the surface of the plate of the shield component 220 is contaminated by by-products, loss of radicals increases, thus leading to a reduction in process performance. In this case, the plasma processing apparatus 1000 may supply oxygen gas into the chamber, and apply high-frequency power to the shield component 220. If high-frequency power is applied to the shield component 220, the shield component 220 may perform corona discharge of a CCP structure to remove deposits from the upper surface of the plate, thus restoring the process performance. The corona discharge is a process where oxygen gas is introduced without a substrate, and plasma is discharged to clean the surface.

Figure 11:
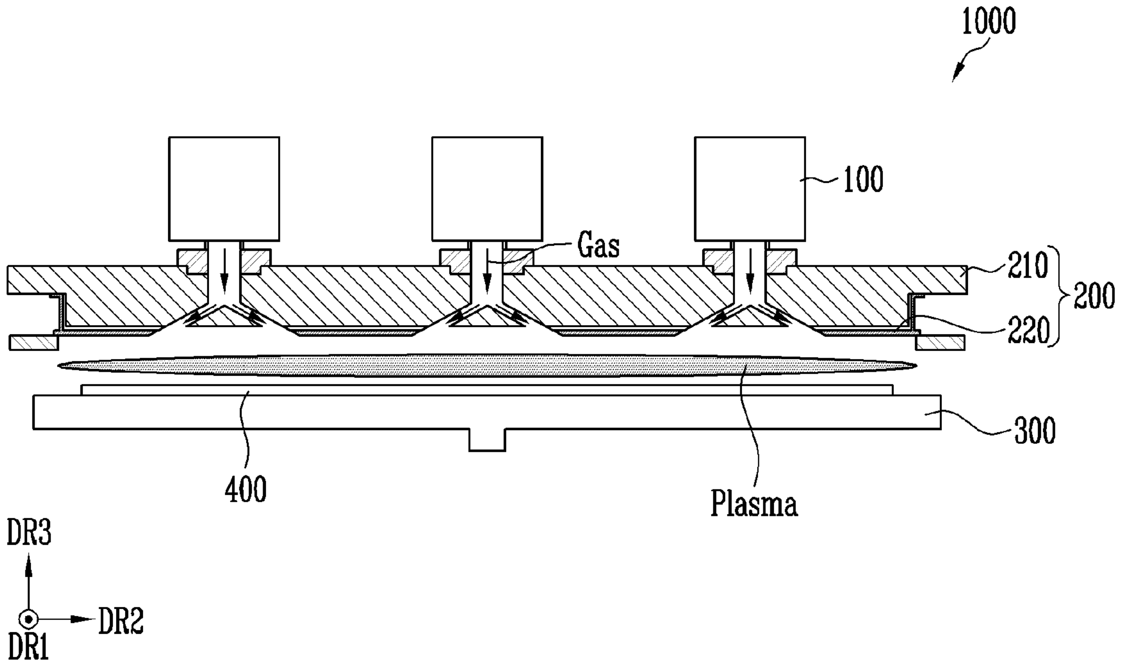
FIG. 11 is a sectional view illustrating an embodiment of the plasma processing apparatus including the plasma shield assembly of FIG. 1.

FIG. 11 is a sectional view illustrating another embodiment of the plasma processing apparatus 1000 including the plasma shield assembly 200 of FIG. 1.

Referring to FIG. 11, an example of separating a substrate 400 from the lower electrode 300 through corona discharge in the plasma processing apparatus 1000 can be explained.

Various processes on a substrate for semiconductor elements may be performed in a state where the interior of the chamber is in a plasma or vacuum state. In this case, the plasma processing apparatus 1000 may generate electrostatic force to secure the substrate 400 on the substrate support disposed in the chamber. For example, the plasma process apparatus 1000 may apply high-frequency power to the lower electrode 300, thus generating electrostatic force. When high-frequency power is applied, the lower electrode 300 may generate positive charges, and the substrate 400 disposed on the lower electrode 300 may be induced with negative charges. Hence, attractive force is generated between the lower electrode 300 and the substrate 400, thus fixing the substrate 400 in place.

Conversely, if the plasma processing apparatus 1000 interrupts the high-frequency power provided to the lower electrode 300, the substrate 400 may be separated from the lower electrode 300. In this case, current may remain on the surface of the lower electrode 300, whereby there may be residual electrostatic force. The residual electrostatic force may impede the separation of the substrate 400 from the lower electrode 300. When the substrate 400 is separated from the lower electrode 300, the substrate 400 may be excessively bent or stressed, thus being damaged.

In an embodiment, in the case where the substrate 400 is separated from the lower electrode 300 after the plasma processing device 1000 performs the process of using the remote plasma method, the shield component 220 may form a capacitor coupled plasma (CCP) structure along with the lower electrode 300, thus preventing the substrate 400 from being damaged due to residual electrostatic force. For example, if high-frequency power is applied to the shield component 220, the shield component 220 may function as the upper electrode in the CCP structure, thus allowing the corona discharge to be performed. Through exposure to the generated high-density plasma, residual electrostatic force that has not removed may be offset. As a result, the substrate 400 may be separated from the lower electrode 300 without being damaged.

Various embodiments of the present disclosure may provide a plasma shield assembly with improved process performance, and a plasma processing apparatus including the plasma shield assembly.

The effects of the present disclosure are not limited by the foregoing, and other various effects are anticipated herein.

Although certain embodiments and implementations have been described herein, other embodiments and modifications will be apparent from the foregoing description. Accordingly, the concepts of the present disclosure are not limited to the foregoing embodiments, but rather to the broader scope of the presented claims and various obvious modifications and equivalent arrangements.

What is claimed is:

1. A plasma shield assembly comprising:

a guide component including first through holes connected to plasma generators that generate radicals using process gas wherein each of the first through holes is connected to one of the plasma generators; and a shield component detachably coupled to the guide component and disposed on a lower surface of the guide component, and including second through holes aligned with the first through holes to pass the radicals from the first through holes, wherein the shield component is spaced apart from the lower surface of the guide component with a gap formed between the shield component and the guide component, and bumper rings disposed adjacent to the second through holes to prevent the radicals from entering the gap.

2. The plasma shield assembly according to claim 1, wherein each of the bumper rings is disposed in the gap and encloses one of the second through holes.

3. The plasma shield assembly according to claim 2, wherein each of the bumper rings is fastened to one surface of the shield component by bolts provided along a circumference of at least one of the bumper rings.

4. The plasma shield assembly according to claim 1, wherein the bumper rings are formed of insulating material.

5. The plasma shield assembly according to claim 1, wherein each of outlets of the first through holes adjacent to the second through holes has a radial shape.

6. The plasma shield assembly according to claim 5, wherein the guide component further comprises diffusion patterns disposed in the outlets, each of the outlets having the radial shape, and wherein each of the diffusion patterns has a conical shape.

7. The plasma shield assembly according to claim 1, wherein each of the second through holes of the shield component has a sloped sidewall forming an acute angle with respect to the lower surface of the guide component.

8. The plasma shield assembly according to claim 7, wherein a width of the sloped side wall increases with distance from the guide component.

9. The plasma shield assembly according to claim 1, wherein the shield component comprises a plate defining the second through holes and spaced apart from the lower surface of the guide component to define the gap therebetween.

10. The plasma shield assembly according to claim 9, wherein the shield component includes a groove formed on an edge of the plate, and further comprises support components to make full contact with the groove.

11. The plasma shield assembly according to claim 10, wherein the shield component is fastened to one surface of the guide component by bolts provided along the support components.

12. A plasma shield assembly comprising:

a guide component including first through holes that are connected to plasma generators that generate radicals using process gas wherein each of the first through holes is connected to one of the plasma generators; and a shield component detachably coupled to the guide component and disposed on a lower surface of the guide component, and including second through holes aligned with the first through holes to pass through the second through holes, the radicals transmitted from the plasma generators through the first through holes, wherein the shield component contacts the lower surface of the guide component, and is fastened to the lower surface of the guide component by bolts provided along circumferences of the second through holes.

13. A plasma processing apparatus comprising:

a chamber defining space where a substrate is disposed;

plasma generators disposed on an upper portion of the chamber and configured to generate radicals using process gas;

a guide component including first through holes connected to the respective plasma generators wherein each of the first through holes is connected to one of the plasma generators;

a shield component detachably coupled to the guide component and disposed on a lower surface of the guide component, and including second through holes aligned with the first through holes to pass the radicals from the plasma generators through the first through holes; and a lower electrode disposed to face the plasma generators, and configured to allow the substrate to be mounted thereon, wherein the shield component is spaced from the lower surface of the guide component with a gap formed between the shield component and the guide component, and bumper rings disposed adjacent to the second through holes to prevent the radicals from entering the gap.

14. The plasma processing apparatus according to claim 13, wherein each of the bumper rings is disposed in the gap and encloses one of the second through holes.

15. The plasma processing apparatus according to claim 13, wherein the bumper rings is formed of insulating material.

16. The plasma processing apparatus according to claim 13, wherein each of the second through holes of the shield component has a sloped sidewall forming an acute angle with respect to the lower surface of the guide component.

17. The plasma processing apparatus according to claim 13, wherein the shield component comprises a plate defining the second through holes and spaced apart from the lower surface of the guide component to define the gap therebetween.

18. The plasma processing apparatus according to claim 17, wherein the plate functions as an upper electrode when high-frequency power is applied thereto.

19. The plasma processing apparatus according to claim 18, wherein the high-frequency power is applied to the shied component in case the substrate is separated from the lower electrode.

20. The plasma processing apparatus according to claim 13, wherein the plasma generators convert the process gas to plasma and generate the radicals.

* * * * *